United States Patent
Kuo et al.

[11] Patent Number: 5,844,261
[45] Date of Patent: Dec. 1, 1998

[54] INALGAP DEVICES

[75] Inventors: Jenn-Ming Kuo, Edison; Yu-Chi Wang, Piscataway, both of N.J.

[73] Assignee: Lucent Technologies Inc., Murray Hill, N.J.

[21] Appl. No.: 868,269

[22] Filed: Jun. 3, 1997

[51] Int. Cl.[6] .................... H01L 29/778; H01L 29/812
[52] U.S. Cl. ........................... 257/194; 257/201
[58] Field of Search ................... 257/194, 201, 257/192

[56] References Cited

U.S. PATENT DOCUMENTS

| | | | |
|---|---|---|---|
| 5,319,223 | 6/1994 | Fujita et al. | 257/190 |
| 5,504,353 | 4/1996 | Kuzuhara | 257/194 |

FOREIGN PATENT DOCUMENTS

| | | | |
|---|---|---|---|
| 6-188271 | 7/1994 | Japan | 257/192 |

OTHER PUBLICATIONS

J. Dickmann, et al., "(Al0.7Ga0.3)0.5In0.5PIn0.15Ga0.85As/GaAs Heterostructure Field Effect Transistors with Very Thin Highly p–Doped Surface Layer," IEEE Trans. Electron. Dev., vol. 42, No. 1, Jan. 1995, pp. 2–7.
Watanabe et al., *Journal of Applied Physics,* vol. 60, No. 3, pp. 1032–1037 (1986).
Watanabe et al., *Applied Physics Letters,* vol. 50, No. 14, pp. 906–908 (1987).
Bachem et al., *Inst. Phys. Conf.* Ser. No. 136, Ch.2, pp. 35–40 (1993).
Kuo, *Thin Solid Films,* vol. 231, pp. 158–172 (1993).
Kuo, *Applied Physics Letters,* vol. 62, No. 10, pp. 1105–1107 (1993).
Takikawa et al., *IEEE Electron Device Letters,* vol. 14, No. 8, pp. 406–408 (1993).
Pereiaslavets et al., *IEEE Electron Device Letters,* vol. 43, No. 10, pp. 1659–1663 (1996).

*Primary Examiner*—John Guay
*Attorney, Agent, or Firm*—E. E. Pacher

[57] ABSTRACT

In a DH-PHEMT the channel layer comprises InGaAs and the donor layers comprise $In_{0.5-q}(Al_xGa_{1-x})_{0.5+q}P$ in which the mole fraction of Al is in the range of about $0.2 \leq x \leq 0.3$. In another embodiment, an InAlGaP layer forms a Schottky barrier gate contact with a barrier height of about 1.0 eV and hence low leakage current. The devices exhibit high 2DEG density, current drivability, and breakdown voltage, making them suitable for low voltage application such as battery-powered, portable wireless equipment. The Schottky barrier contact may be used in devices other than HEMTs.

13 Claims, 3 Drawing Sheets

INALGAP DEVICES

FIELD OF THE INVENTION

This invention relates generally to semiconductor devices and, more particularly, to field effect transistors (FETs); e.g., a class of such transistors variously known as selectively-doped heterojunction transistors (SDHTs), high electron mobility transistors (HEMTs), and modulation-doped FETs (MODFETs).

BACKGROUND OF THE INVENTION

The demand for low supply voltage power transistors with high efficiency is growing for portable, battery-powered wireless communication applications because the power amplifiers in the RF block (e.g., in the transmitter or receiver) consume the largest amount of battery power. HEMTs are an excellent candidate for such applications due to their high maximum drain current ($I_{max}$), low knee voltage ($V_k$), and high cutoff frequencies ($f_T$ and $f_{max}$). To meet the system output power requirement while operating at very low DC supply voltage (e.g., below 3 V), the HEMT design can be modified to either increase the total gate width or increase the available drain current density. However, a larger gate width tends to lower the output impedance which makes output matching more difficult. In addition a larger gate width is usually accompanied by an increase in leakage current, which in turn tends to produce instability in the quiescent gate bias. Therefore, the preferred way to maintain the power performance at low supply voltages is to increase the drain current density.

A larger drain current density (also known as current drivability) translates into a larger two-dimensional electron gas (2DEG) density in the channel of the HEMT. In order to have the higher density 2DEG, the channel has to be bounded by a heterojunction (or a pair of heterojunctions) having a relatively high conduction band energy discontinuity ($\Delta E_c$). The magnitude of this discontinuity is a function of the materials which make up the heterojunctions. Multi-layered structures having at least one heterojunction are commonly referred to as heterostructures.

There are two basic classes of heterojunctions: lattice-matched and pseudomorphic. As the term implies, a lattice-matched heterojunction comprises adjacent, different bandgap layers which have essentially the same lattice constant. Therefore, few dislocations are formed in the layers. An example is the ternary/binary $Al_xGa_{1-x}As/GaAs$ materials system in which $\Delta E_c$=0.19 eV, and x<0.23 in order to prevent the formation of donor complex (DX) centers which cause ineffective donor activation. Another lattice-matched materials system is the quaternary/binary $In_{0.5}(Al_xGa_{1-x})_{0.5}P/GaAs$. According to M. O. Watanabe et al., *Applied Physics Letters*, Vol. 60, pp. 906–908 (1986), which is incorporated herein by reference, the conduction band discontinuity $\Delta E_c$ of the $In_{0.5}(Al_xGa_{1-x})_{0.5}P/GaAs$ lattice-matched heterojunctions increases linearly for 0<x<0.7 to a maximum of about 0.38 eV, and then decreases linearly for 0.7<x<1.0. In contrast, a pseudomorphic heterojunction comprises adjacent, different bandgap layers which are not lattice matched. But, the layers are made sufficiently thin to reduce strains so that few dislocations are formed in the layers. From a theoretical standpoint, pseudomorphic heterojunctions can be engineered to have higher $\Delta E_c$ than corresponding lattice-matched heterojunctions, but little data has been published on the subject. Such heterojunctions are commonly formed between InGaAs, which has a smaller bandgap and higher mobility than GaAs, and either of the ternary or the quaternary materials discussed above.

To take advantage of the expected higher $\Delta E_c$ of $In_{0.5}(Al_xGa_{1-x})_{0.5}P/InGaAs$ pseudomorphic heterojunctions and the higher electron mobility of InGaAs, HEMTs have been designed in which the channel comprises InGaAs and the donor supply layer (hereinafter donor layer) comprises $In_{0.5}(Al_xGa_{1-x})_{0.5}P$. However, this material system is not without its problems. To better appreciate the difficulties consider the end points of the $In_{0.5}(Al_xGa_{1-x})_{0.5}P$ composition: at x=0, the sheet charge density of the $In_{0.5}Ga_{0.5}P/InGaAs$ HEMT is limited by relatively small $\Delta E_c$, whereas at x=1 the current density and transconductance of $Al_{0.5}In_{0.5}P/InGaAs$ HEMTs are relatively low. See, for example, J-M. Kuo et al., *Applied Physics Letters*, Vol. 62, PP. 1105–1107 (1993) and J-M. Kuo, *Thin Solid Films*, Vol. 231, pp.158–172 (1993), which are both incorporated herein by reference. It is theorized that the limitations of the latter AlInP/InGaAs HEMTs are probably due to the relatively high concentration of donor-related deep levels in the AlInP and/or the insufficient transfer of electrons into the direct bandgap InGaAs channel from the indirect bandgap AlInP donor layer.

SUMMARY OF THE INVENTION

In accordance with one aspect of our invention, a HEMT comprises an InGaAs channel layer which forms a pseudomorphic heterojunction with an $In_{0.5-q}(Al_xGa_{1-x})_{0.5+q}P$ donor layer. The mole fraction of Al in the donor layer is in a relatively narrow range of about $0.2 \leq x \leq 0.3$. Our experiments suggest that such heterojunctions have desirably large $\Delta E_c$ yet low concentrations of donor-related traps. Consequently, HEMTs of this design have relatively high 2DEG density, current drivability, and breakdown voltage. In a preferred embodiment, the HEMT employs two such donor layers in a double heterojunction pseudomorphic HEMT configuration (DH-PHEMT). The power performance of such DH-PHEMTs is attractive for low supply voltage applications.

In accordance with another aspect of our invention, an InAlGaP material is used to form a Schottky barrier contact of a device; e.g., the gate contact of a HEMT. Its relatively high Schottky barrier height in this composition range reduces leakage current.

BRIEF DESCRIPTION OF THE DRAWINGS

Our invention, together with its various features and advantages, can be readily understood from the following more detailed description taken in conjunction with the accompanying drawing, in which.

at 850 MHz for a DH-PHEMT according to FIG. 1 tuned for maximum $P_{out}$; the device had a gate length of 1 μm and gate width of 5 mm.

DETAILED DESCRIPTION OF THE INVENTION

Figure 1:
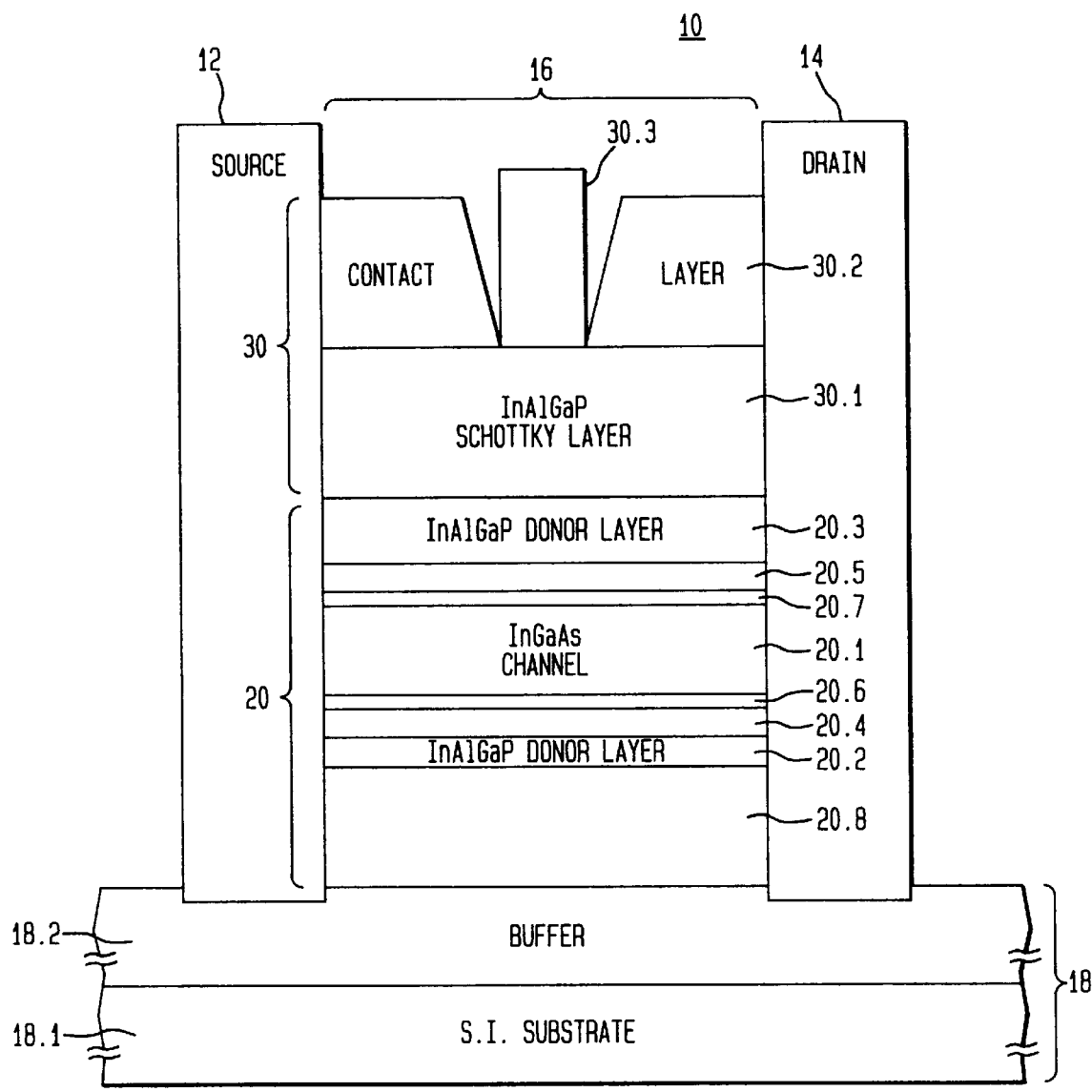
FIG. 1 is a partial block diagram, partial cross section of a DH-PHEMT in accordance with one embodiment of our invention; the semiconductor layers of the device comprise Group III-V compound materials; in the interests of simplicity this figure has not been drawn to scale.

With reference now to FIG. 1. a HEMT 10 according to an illustrative embodiment of our invention comprises a source 12 and a drain 14 both depicted as functional blocks disposed on a support member 18. Interconnecting the source and drain is a heterostructure 16 likewise disposed on support member 18. The latter typically comprises a semi-insulating substrate 18.1 and a buffer layer 18.2 disposed between the heterostructure 16 and the substrate 18.1, as is well known in the art. An optional, defect-gettering super-lattice (not shown) may be included between the substrate and the buffer layer. The heterostructure 16 includes a pair of substructures: a channel structure 20 for supplying electrons to the channel layer 20.1, and a contact structure 30 for controlling the flow of electrons in the channel between the source 12 and drain 14.

The channel structure 20 is illustratively depicted as a double heterostructure, although the invention is not so limited; a single heterostructure can also be utilized depending on the particular output power and performance desired. The double heterostructure comprises two relatively wide bandgap, doped donor layers 20.2 and 20.3 disposed on either side of the narrower bandgap, undoped channel layer 20.1. The heterojunctions at the interfaces between these layers form a quantum well in the channel layer. Electrons flow from the donor layers into the quantum well where they are confined by the conduction band discontinuity. The term undoped layer as used throughout this description means that the layer is not intentionally doped, and in that sense typically has only a very low level of background doping. Such layers are designated i-layers (or i-type layers) even though they are not intrinsic in the ideal sense. The donor layers 20.2 and 20.3 are separated from the channel layer by pairs of i-type spacer layers 20.4, 20.6 and 20.5, 20.7, respectively. The spacer layers serve, in part, to reduce the coulomb scattering of electrons in the channel layer by donor ions in the donor layers. Inner spacer layers 20.6 and 20.7 are disposed adjacent the channel layer 20.1, whereas outer spacer layers 20.4 and 20.5 are disposed adjacent the donor layers 20.2 and 20.3, respectively. Typically, the inner spacer layers have a bandgap which is intermediate that of the channel layer and the outer spacer layers. In embodiments utilizing a single heterostructure, one of the donor layers and its associated spacers (e.g., donor layer 20.2 and spacer layers 20.4 and 20.6) would be omitted. Finally, a pair of relatively wide bandgap i-layers 20.8 and 30.1 are also disposed adjacent the donor layers 20.2 and 20.3, respectively. The layer 20.8 separates the donor layer 20.2 from the buffer layer 18.2, whereas the layer 30.1 is part of the contact structure 30.

More specifically, contact structure 30 comprises a relatively highly doped contact layer 30.2 which facilitates making ohmic contact to the source and drain, a gate electrode 30.3 disposed in an opening formed in layer 30.2, and i-layer 30.1 which is disposed between electrode 30.3 and channel structure 20. In one embodiment, layer 30.1 forms a Schottky barrier at the interface with the electrode 30.3.

The operation of this type of HEMT is well known in the art; i.e., electrons from the donor layers flow across the heterojunctions at the interfaces with the channel layer and are confined in the quantum well formed in that layer. In the on state of the HEMT, the relative voltages between the gate, source and drain are set so that electrons flow in the channel layer between the source and drain, whereas in its off state these voltages are set so that the channel layer is depleted and, therefore, electrons do not flow between the source and drain.

In accordance with one aspect of our invention, the channel layer 20.1 preferably comprises $In_zGa_{1-z}As$ (e.g., z=0.2), and the donor layers (or the single donor layer in the case of a single heterostructure) comprise $In_{0.5-q}(Al_xGa_{1-x})_{0.5+q}P$ in which the Al composition falls within a relatively narrow range of about $0.2 \leq x \leq 0.3$. Both donor layers need not have identical Al compositions, but both should fall within the prescribed range. On the other hand, the values of z and q are chosen to facilitate growth of the layers without generating dislocations. Typically q=0, but in general $0 \leq q \leq 0.35$ is suitable. When q>0.35, the number of DX centers generated may be undesirable.

Within this narrow range of Al composition our experiments suggest that the particular InAlGaP/InGaAs heterojunctions have sufficiently high conduction band discontinuity $\Delta E_c$ and an insignificant number of donor-related deep levels, to enable our HEMTs to exhibit relatively high 2DEG density (e.g., $>6 \times 10^{12}$ cm$^{-2}$), current drivability (e.g., $I_{max}$= 550 mA/mm), and breakdown voltage (e.g., $V_{gd}$=11 V; and $V_{ds}$=9 V in the off state). These characteristics make our HEMTs especially suitable for low voltage supply applications. However, when the Al composition is less than about x=0.2, $\Delta E_c$ may not be sufficiently large to provide an adequate the 2DEG. When x=0.3 our persistent photoconductivity (PPC) measurements confirmed that the number of donor-related deep levels was still small compared to the number of shallow levels, but when x=0.5 the number of deep levels increased dramatically; i.e., the carrier concentration $n_D$ at 77° K. in the absence of illumination absorbed in the donor layers (i.e., in the dark) was compared to the carrier concentration $n_L$ at 77° K. in the presence of such illumination and to the room temperature carrier concentration $n_{RT}$. At x=0.3 we measured $n_D$=3.4×10$^{17}$ cm$^{-3}$ and $n_L$=1.3×10$^{18}$ cm$^{-3}$, whereas at x=0.5 $n_D$ was not detectable and $n_L$=2.1×10$^{16}$ cm$^{-3}$, indicating a significant number of deep levels for this higher Al composition. Hence, we conclude that the desirable Al composition is approximately $0.2 \leq x \leq 0.3$.

In accordance with another aspect of our invention, the leakage current of a HEMT, such as the one depicted in FIG. 1, is reduced by also making the Schottky layer 30.1 of $In_{0.5-q}(Al_xGa_{1-x})_{0.5+q}P$; preferably $x \geq 0.2$ approximately. As a result, Schottky barrier heights as high as 1.0 eV at x=0.3 have been achieved. But, this aspect of our invention is not so limited; i.e., this quaternary material may be a useful Schottky barrier layer even at Al compositions which exceed the value of x at the direct-indirect bandgap crossover.

EXAMPLE

This example describes a DH-PHEMT in accordance with the various aspects of our invention described above. The device was fabricated using gas-source molecular beam epitaxy (GSMBE) and optical lithography techniques of the type described by one of us, J-M. Kuo in *Thin Solid Films*, supra. Si was used as the n-type dopant for the donor layers and the contact layer. The various parameters, dimensions, materials, operating conditions, etc. are provided by way of illustration only, and are not intended to be limitations on the scope of the invention unless expressly so stated.

From a structural standpoint the device was formed on a 5000 Å (Angstroms) thick i-type buffer layer 18.2 grown on a semi-insulating GaAs substrate 18.1. The channel layer 20.1 comprised a 120 Å thick $In_{0.2}Ga_{0.8}As$ i-layer. The inner spacer layers 20.6 and 20.7 both were 20 Å thick GaAs i-layers, and the outer spacer layers 20.4 and 20.5 were, respectively, 50 Å and 30 Å thick InAlGaP i-layers. The donor layers 20.2 and 20.3 were, respectively, 30 Å and 70 Å thick InAlGaP n-type layers. The Schottky layer 30.1 and the lower layer 20.8 were, respectively, 250 Å and 200 Å thick InAlGaP i-layers. All InAlGaP layers of this device had the composition $In_{0.5}(Al_{0.3}Ga_{0.7})_{0.5}P$. The contact layer 30.2 was a 500 Å thick n⁺-type GaAs layer. Lastly, the gate electrode 30.3 was a 3700 Å thick layer of Ti/Pt/Au, and the source and drain electrodes (not shown) were both 2000 Å thick composite layers of Ge/Ni/AuGe/Ag/Au Making the Schottky layer 30.1 of the quaternary composition provided advantages beyond increased Schottky barrier height; namely, better control of gate recess process, threshold voltage and yield, all resulting, at least in part, from the ability to exploit the etching selectivity between binary contact layer 30.2 and quaternary Schottky layer 30.1 when forming the opening in the contact layer for the electrode 30.3.

Figure 2:
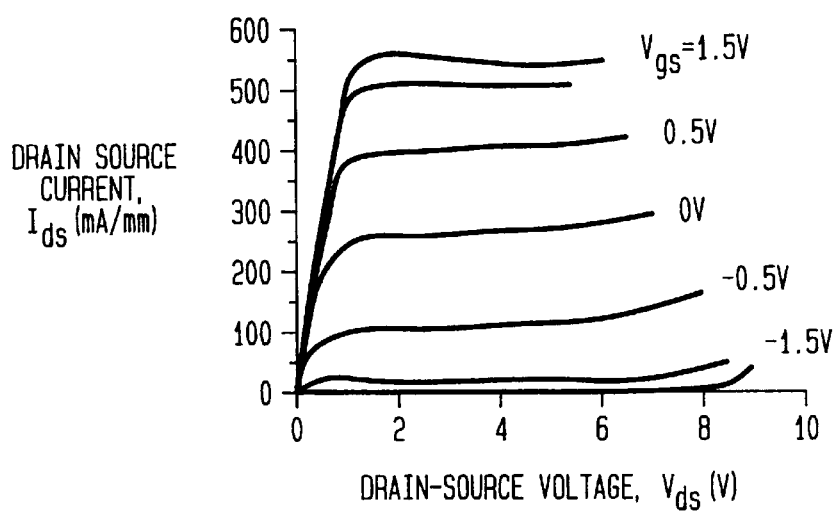
FIG. 2 is an I-V characteristic of a device according to FIG. 1 having a gate length of 1 $\mu$m and a gate width of 60 $\mu$m.
Figure 3:
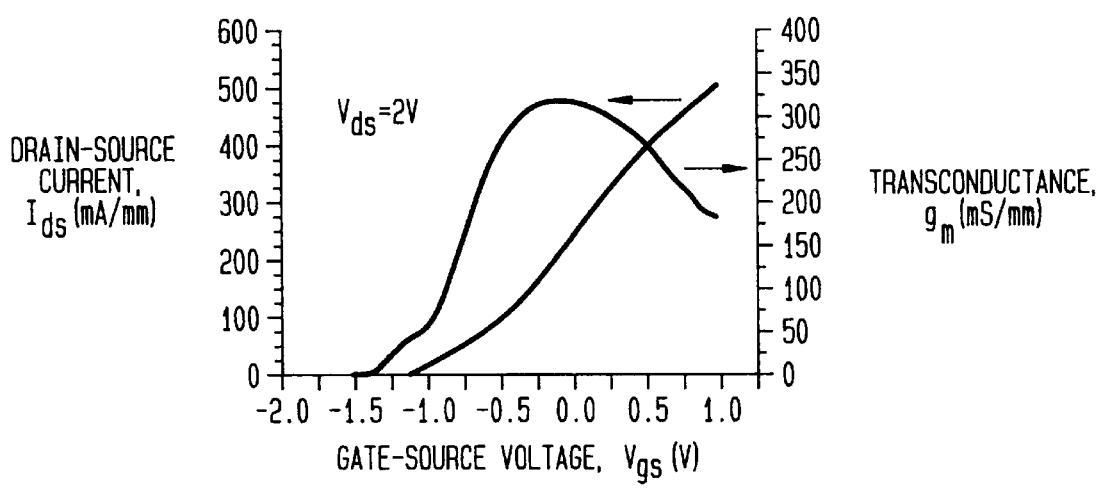
FIG. 3 is a graph of drain-source current and transconductance versus gate-source voltage of a device according to FIG. 1 having a gate length of 1 $\mu$m and a gate width of 60 $\mu$m.
Figure 4:
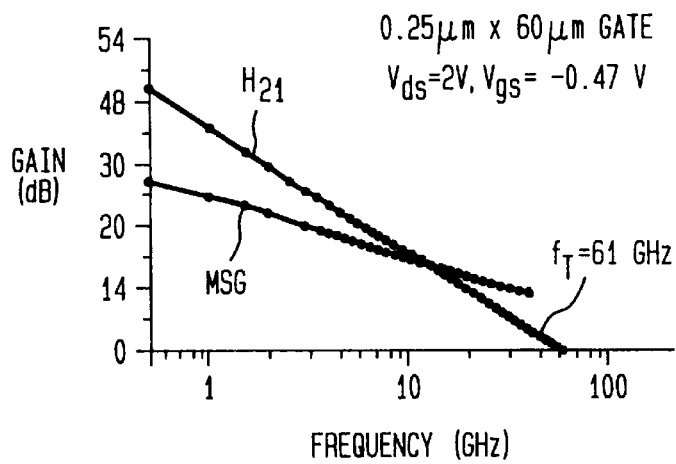
FIG. 4 is a graph of short circuit current gain ($H_{21}$) and maximum stable gain (MSG) versus frequency of a device according to FIG. 1 having a gate length of 0.25 $\mu$m and a gate width of 60 $\mu$m; the device was operated at $V_{ds}$=2 V and $V_{gs}$=−0.47 V.

We performed a number of tests and measurements which demonstrated that our invention has significant potential for one-battery-cell operated portable wireless communication applications. For example, we measured a 2DEG density of $6.5 \times 10^{12}$ cm$^{-2}$ which to our knowledge is higher than any density ever realized for prior art GaAs-based HEMTs (i.e., HEMTs grown on GaAs substrates). This parameter leads to enhanced current drivability as demonstrated by the I–V characteristics of FIG. 2. The device, which had gate length x width of 1 μm×60 μm, exhibited $I_{max}$ of 550 mA/mm. The same device had a transconductance $g_m$ of 320 mS/mm (FIG. 3). It also exhibited a unity gain cut-off frequency $f_T$ of 21 GHz and a power gain cut-off frequency $f_{max}$ of 64 GHz. In contrast, these cut-off frequencies were increased to 61 GHz and 170 GHz in similar DH-PHEMTs in which the gate length was reduced to 0.25 μm (FIG. 4).

Using well-known I–V and C–V techniques we also measured the Schottky barrier heights described earlier. From this data we estimate that the leakage current, which is very small, to be about 60–80 nA at 5 V reverse bias for a device having a gate width of 60 μm.

Figure 5:
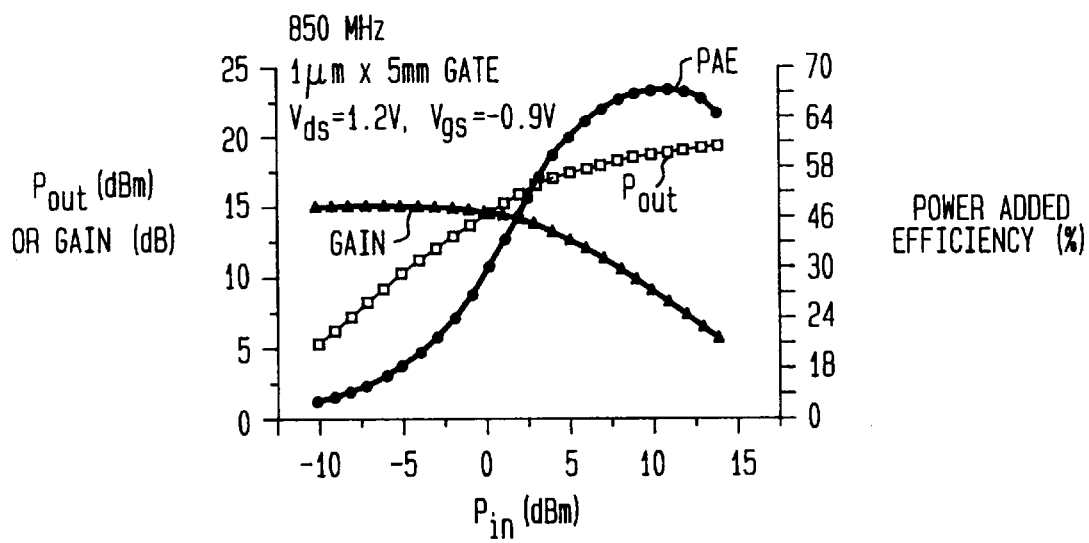
FIG. 5 is a graph of output power ($P_{out}$), power added efficiency (PAE), and gain as a function of input power ($P_{in}$)
Figure 6:
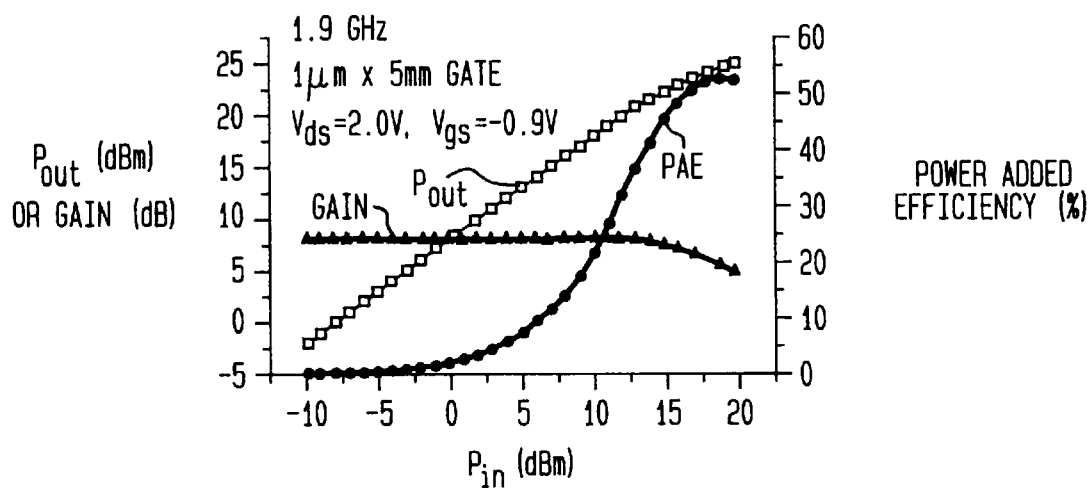
FIG. 6 is a graph of $P_{out}$, PAE, and gain as a function of $P_{in}$ at 1.9 GHz for a DH-PHEMT according to FIG. 1 tuned for maximum $P_{out}$ the device had a gate length of 1 μm and a gate width of 5 mm.

The power performance of a DH-PHEMT having a gate length x width of 1 μm×5 mm is shown in FIGS. 5 and 6. Measurement were made at both 850 MHz (FIG. 5) and 1.9 GHz (FIG. 6) with DC supply voltages of 1.2 V and 2 V for each frequency. At 850 MHz and $V_{ds}$=1.2 V (the voltage of one NiCd or NiMH (Ni Metal Hydride) battery cell), when the device was tuned for maximum output power, a 65.2% power added efficiency (PAE), a 15.2 dB linear gain $G_L$, and a 19.6 dB saturated output power $P_{sat}$ were obtained. When biased at $V_{ds}$=2 V, the PAE, $G_L$, and $P_{sat}$ were increased to 68.2%, 15.8 dB, and 24 dBm, respectively. When the device was tested at 1.9 GHz and $V_{ds}$=2 V, the maximum output power was 25 dBm with a maximum PAE of 53% and $G_L$ of 8.3 dB. The output power and PAE at the 1 dB compression point were as high as 23 dBm and 48.8%, respectively. As noted earlier, these results indicate the significant potential of our DH-PHEMT for one-battery-cell operated portable wireless communication applications. Of course, the invention is also useful in other applications as well.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the donors in the donor layers may be distributed essentially uniformly across the layer thickness (as in MODFETs), or may be concentrated in a narrow band or region (known in the art as δ-doping). In addition, as noted earlier, the Schottky barrier aspect of our invention may be used with devices (e.g., diodes, transistors, etc.) other than those in the HEMT, SDHT, MODFET family. For example, the quaternary $In_{0.5-q}(Al_xGa_{1-x})_{0.5+q}P$ material with $x \geq 0.2$ approximately may be used to form a Schottky barrier gate contact in a doped-channel FET.

What is claimed is:

1. A transistor comprising a source and a drain, a heterostructure including a narrow bandgap channel layer coupling said source to said drain and in which a quantum well is formed to confine electrons, and first and second wider bandgap donor layers disposed on opposite sides of said channel layer for supplying said electrons to said quantum well, and a gate contact structure for applying voltage to said heterostructure to control the flow of electrons in said channel layer between said source and said drain, characterized in that said channel layer comprises InGaAs and each of said donor layers comprises $In_{0.5-q}(Al_xGa_{1-x})_{0.5+q}P$ in which the mole fraction of Al is about $0.2 \leq x \leq 0.3$, said channel layer and each of said donor layers forming a pseudomorphic heterojunction at the interface between them and said heterostructure further includes a first pair of spacer layers disposed between said first donor layer and said channel layer and a second pair of spacer layers disposed between said second donor layer and said channel layer, each pair comprising an i-type GaAs layer adjacent said channel layer and an i-type InAlGaP layer adjacent one of said donor layers.

2. The invention of claim 1 wherein $0 \leq q \leq 0.35$ approximately.

3. The invention of claim 1 wherein said gate contact structure includes a gate electrode and a third wide bandgap layer forming a Schottky barrier with said electrode, further characterized in that said third layer also comprises $In_{0.5-q}(Al_xGa_{1-x})_{0.5+q}P$ in which the mole fraction of Al is about $x \geq 0.2$ and $0 \leq q \leq 0.35$ approximately.

4. The invention of claim 3 wherein the composition of said third layer produces a Schottky barrier height of about 1.0 eV.

5. The invention of claim 1 wherein said channel layer comprises an $In_{0.2}Ga_{0.8}As$ i-type layer and said donor layer comprises an $In_{0.5}(Al_{0.3}Ga_{0.7})_{0.5}P$ n-type layer.

6. A high electron mobility transistor comprising a source and drain, a heterostructure comprising an i-type $In_{0.2}Ga_{0.8}As$ channel layer coupling said source to said drain and in which a quantum well is formed for confining electrons, a pair of $In_{0.5-q}(Al_xGa_{1-x})_{0.5+q}P$ Si-doped, n-type donor layers disposed on opposite sides of said channel layer for supplying said electrons to said quantum well, the mole fraction of Al in each of said donor layers falling in the range of about $0.2 \leq x \leq 0.3$, and first and second pairs of spacer layers separating said donor layers from said channel layer, each of said pairs comprising an i-type GaAs layer adjacent said channel layer and an i-type InAlGaP layer adjacent one of said donor layers and a gate contact structure for applying voltage to said heterostructure including a Si-doped, n-type GaAs contact layer having and opening therein, a gate electrode disposed in said opening, and an i-type $In_{0.5-q}(Al_xGa_{1-x})_{0.5+q}P$ layer forming a Schottky barrier with said gate electrode, wherein $x \geq 0.2$ and $0 \leq q \leq 0.35$ approximately.

7. The invention of claim 6 wherein the mole fraction of Al in said i-type layer produces a Schottky barrier height of at least about 1.0 eV.

8. The invention of claim 6 wherein said donor layers comprise $In_{0.5-q}(Al_{0.3}Ga_{0.7})_{0.5+q}P$.

9. The invention of claim 8 wherein q=0.

10. A transistor comprising a source and a drain, a heterostructure including a narrow bandgap channel layer coupling said source to said drain and in which a quantum well is formed to confine electrons, and first and second wider bandgap donor layers disposed on opposite sides of said channel layer for supplying said electrons to said quantum well, and a gate contact structure for applying voltage to said heterostructure to control the flow of electrons in said channel layer between said source and said drain, characterized in that said channel layer comprises InGaAs and each of said donor layers comprises $In_{0.5-q}(Al_xGa_{1-x})_{0.5+q}P$ in which the mole fraction of Al is about $0.2<x<0.3$, said channel layer and each of said donor layers forming a pseudomorphic heterojunction at the interface between them, and said heterostructure further includes a first pair of spacer layers disposed between said first donor layer and said channel layer and a second pair of spacer layers disposed between said second donor layer and said channel layer, each pair comprising an i-type As-containing, P-absent Group III-V compound inner spacer layer adjacent said channel layer and an i-type P-containing, As-absent Group III-V compound outer spacer layer adjacent one of said donor layers, said inner spacer layer having a bandgap which is intermediate that of said channel layer and said outer spacer layer.

11. The invention of claim 10 wherein $0 \leq q \leq 0.35$ approximately.

12. The invention of claim 10 wherein said gate contact structure includes a gate electrode and a third wide bandgap layer forming a Schottky barrier with said electrode, further characterized in that said third layer also comprises $In_{0.5-q}(Al_xGa_{1-x})_{0.5+q}P$ in which the mole fraction of Al is about $x \geq 0.2$ and $0 \leq q \leq 0.35$ approximately.

13. The invention of claim 12 wherein the composition of said third layer produces a Schottky barrier height of about 1.0 eV.

* * * * *